US008558577B1

(12) United States Patent
Soriano Fosas et al.

(10) Patent No.: US 8,558,577 B1
(45) Date of Patent: Oct. 15, 2013

(54) SYSTEMS AND METHODS FOR BIDIRECTIONAL SIGNAL SEPARATION

(75) Inventors: David Soriano Fosas, Barcelona (ES); Marc Bautista Palacios, Barcelona (ES); Laura Portela Mata, Barcelona (ES)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/562,725

(22) Filed: Jul. 31, 2012

(51) Int. Cl.
*H03K 19/094* (2006.01)
*H03K 19/0175* (2006.01)
*H03K 3/00* (2006.01)
*H03B 1/00* (2006.01)
*G05F 1/10* (2006.01)
*G05F 3/02* (2006.01)

(52) U.S. Cl.
USPC ............... 326/83; 326/62; 327/108; 327/535; 710/100

(58) Field of Classification Search
USPC ............... 326/82, 83, 68, 112, 115, 126, 127, 326/108, 109; 710/110
See application file for complete search history.

(56) References Cited

U.S. PATENT DOCUMENTS

| | | | |
|---|---|---|---|
| 5,790,526 A * | 8/1998 | Kniess et al. ................. | 370/257 |
| 6,078,192 A * | 6/2000 | Mitten et al. .................... | 326/82 |
| 6,618,774 B1 * | 9/2003 | Dickens et al. ................. | 710/64 |
| 7,088,137 B2 | 8/2006 | Behrendt et al. | |
| 7,248,095 B2 * | 7/2007 | Uratani et al. ................ | 327/535 |
| 7,692,450 B2 | 4/2010 | Aranovsky | |
| 2007/0206774 A1 * | 9/2007 | Vorenkamp et al. .......... | 379/310 |
| 2010/0066409 A1 * | 3/2010 | Rodriguez et al. ............. | 326/62 |
| 2012/0082166 A1 * | 4/2012 | Sala et al. ..................... | 370/401 |

OTHER PUBLICATIONS

NXP, "True I2C-Bus Buffering for Long-Distance Communications," NXP I2C-Bus Buffers, P82B96 and PCA9600, Oct. 2007, NXP.com; 4 pp.
NXP; P82B715 I2C-Bus Extender, Rev. 08-9 Nov. 2009, Product Data Sheet, NXP.com; 23 pp.

* cited by examiner

*Primary Examiner* — Shawki Ismail
*Assistant Examiner* — Dylan White
(74) *Attorney, Agent, or Firm* — Garry Perry

(57) ABSTRACT

A signal separation module includes a single-ended bidirectional pin coupled to a processing device, a single-ended unidirectional output pin coupled to a differential signal transceiver, a single-ended unidirectional input pin coupled to the differential signal transceiver, and signal separation logic. The signal separation logic is to detect a current flow condition that indicates the bidirectional pin is asserted by the processing device; assert, as a result of the existence of the current flow condition, the unidirectional output pin and prevent the unidirectional input pin from affecting the bidirectional pin; detect an opposite current flow condition that indicates that the unidirectional input pin is asserted by the differential signal transceiver; and assert, as a result of the existence of the opposite current flow condition, the bidirectional pin and prevent the assertion of the bidirectional pin from affecting the unidirectional output pin.

18 Claims, 3 Drawing Sheets

SYSTEMS AND METHODS FOR BIDIRECTIONAL SIGNAL SEPARATION

BACKGROUND

Inter-integrated circuit (I2C) communication protocol is based on a single-ended bidirectional bus and is intended primarily for attaching low-speed peripherals or devices to a motherboard or similar electronic device where the physical separation between devices is minimal. Single-ended buses are less robust in terms of both transmission speeds and transmission distances compared to differential buses. As a result, connecting an external device such as a printer to an I2C chip is difficult, because of the distance limitations of a single-ended bus.

Differential signal transceivers convert single-ended signals to differential signals, which are suitable for transmission over greater distances. Certain differential signal transceivers require a unidirectional TX input (e.g., from the I2C chip) and supply a unidirectional RX output (e.g., to the I2C chip). However, as explained above, the I2C protocol is based on a bidirectional input/output pin.

BRIEF DESCRIPTION OF THE DRAWINGS

For a detailed description of various examples of the invention, reference will now be made to the accompanying drawings in which.

NOTATION AND NOMENCLATURE

Figure 1:
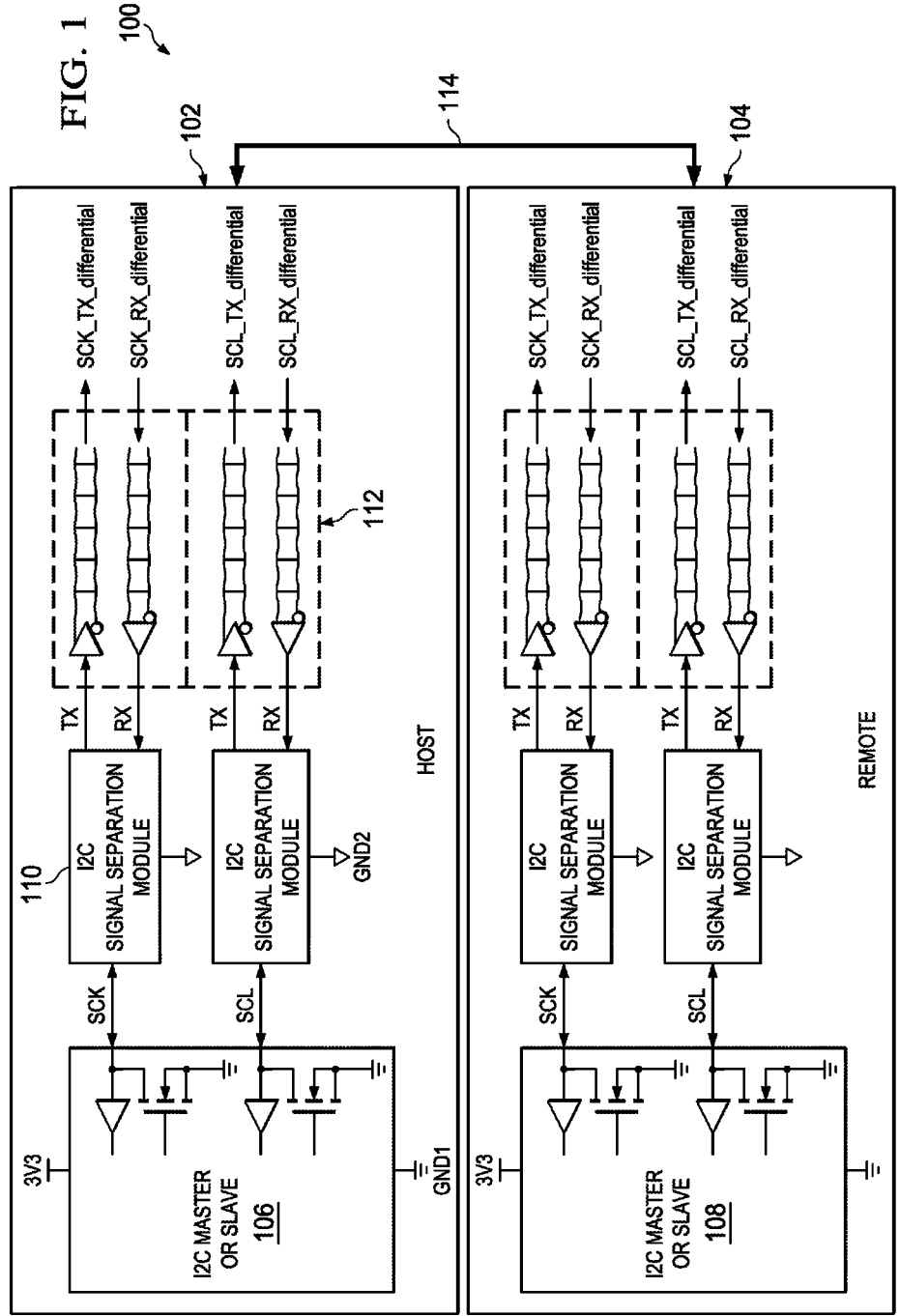
FIG. 1 shows a block diagram of an I2C system in accordance with various examples.

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

As used herein, the term "single-ended bus" refers to a bus that transmits signals over one wire using a voltage value referenced to ground to indicate a value. For example, a 3.3V single-ended bus may indicate a 1 by transmitting a voltage near 3.3V and indicate a 0 by transmitting a voltage near 0.0V.

As used herein, the term "differential bus" refers to a two-wire bus that each transmits a voltage value referenced to ground. The voltage differential between the two wires indicates a value. For example, a 0 is indicated if the voltage on the first wire is greater than the voltage on the second wire and a 1 is indicated if the voltage on the second wire is greater than the voltage on the first wire.

As used herein, the term "unidirectional signal" refers to a signal that only travels from a transmitter to a receiver. That is, the receiver is not capable of or is not expected to send a signal to the transmitter.

As used herein, the term "bidirectional signal" refers to a signal that may travel from a first transceiver to a second transceiver, or vice versa. Typically, bidirectional signals require a communication scheme that ensures that both transceivers are not attempting to transmit signals (or "talk to each other") at the same time.

As used herein, the term "CAN transceiver" refers to an example type of differential signal transceiver that converts single-ended signals into differential signals, and vice versa.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

A signal separation module may be placed between the I2C chip and the differential signal transceiver to convert the bidirectional signals from the I2C chip to unidirectional signals for the differential signal transceiver, and vice versa. Although explained with respect to an I2C interface, the present disclosure may apply to other bus types. I2C protocol is based on an open drain pin (for both a data line and clock line), meaning that the output is high voltage (e.g., 3.3V or 5V) when the pin is not being asserted and is driven to nearly 0V when the pin is asserted. Different devices may have different voltage levels when being driven to 0V. For example, one device may have an asserted voltage level of 0.4V while another device may have an asserted level of 0.5V, but because both of these are below a predefined threshold (e.g., 0.8V), the signals are interpreted as being asserted.

Certain signal separation modules rely on the known voltage differences of asserted signals from different devices to determine which device is asserting its pin, and thus whether to assert a TX pin (to the differential signal transceiver) or the bidirectional pin (to the I2C chip). Unfortunately, these voltage level-based signal separation modules require expensive analog comparators to determine precise voltage levels. Additionally, voltage levels are sensitive to noise, which can be present in many industrial applications or other applications where electromagnetic noise levels may be high (e.g., commercial printer applications).

FIG. 1 shows an I2C communication system 100 in accordance with various implementations of the present disclosure. The I2C communication system 100 includes a host device 102 coupled to a remote device 104 by way of an interconnect 114. The interconnect 114 enables the host device 102 and the remote device 104 to be separated by a distance, which in some cases may be on the order of tens of meters. The host device 102 includes a processing device 106, which in this case is an I2C chip, that transmits and receives SCK (clock) and SCL (data) signals, which are single-ended bidirectional signals, to and from signal separation modules 110. A differential signal transceiver 112 converts the single-ended TX signal from the signal separation module 110 to a differential TX signal to be transmitted over the interconnect 114. Similarly, the differential signal transceiver 112 converts the differential RX signal to a single-ended RX signal to be transmitted to the signal separation module 110. As shown, there is a differential signal transceiver 112 for each of the SCK and SCL signals.

The remote device 104 includes a processing device 108, which in this case is an I2C chip, and other elements similar to those found in the host device 102. However, it is noted that when signals are transferred between the host device 102 and the remote device 104, the operation of each device is essentially opposite. For example, a TX signal from one device is received as an RX signal at the other device, and vice versa.

Unlike voltage levels, which may be easily affected by environmental noise, the direction of current flow through the signal separation module 110 is when either the I2C chip 106 or the I2C chip 108 asserts a pin is not affected by noise. For example, regardless of noise and voltage levels, when the I2C chip 106 asserts a pin (i.e., drives the pin to 0V), current flows into that pin of the I2C chip 106. That is, current flows from right to left through the signal separation module 110. Similarly, when the I2C chip 108 asserts a pin (i.e., drives the pin to 0V), current flows into that pin of the I2C chip 108. That is, current flows from left to right through the signal separation module 110. The direction of current flow is not affected by environmental noise, unlike asserted voltage levels of the various devices' 106, 108 bidirectional pins.

The signal separation module 110 must have certain functionality to avoid confusion at the I2C chip 106 level while converting a bidirectional signal (i.e., the I2C chip 106 pin) to a unidirectional signal (i.e., the TX pin to the differential signal transceiver 112) and converting a unidirectional signal (i.e., the RX pin from the differential signal transceiver 112) to a bidirectional signal (i.e., the I2C chip 106 pin). For example, when the I2C chip 106 asserts its bidirectional I2C pin, the incoming RX signal to the signal separation module 110 should not impact the bidirectional I2C pin. Similarly, when the incoming RX signal to the signal separation module 110 drives the I2C chip's 106 bidirectional I2C pin low, the signal separation module should not interpret this as the I2C chip 106 asserting the bidirectional I2C pin and cause the TX signal to be driven low. To summarize, the signal separation module 110 should be aware of who is driving a particular signal low, the I2C chip 106, or the I2C chip 108 of the remote device 104. As explained above, this is achieved by determining a direction of current flow, or the existence of a particular current flow condition.

Figure 2:
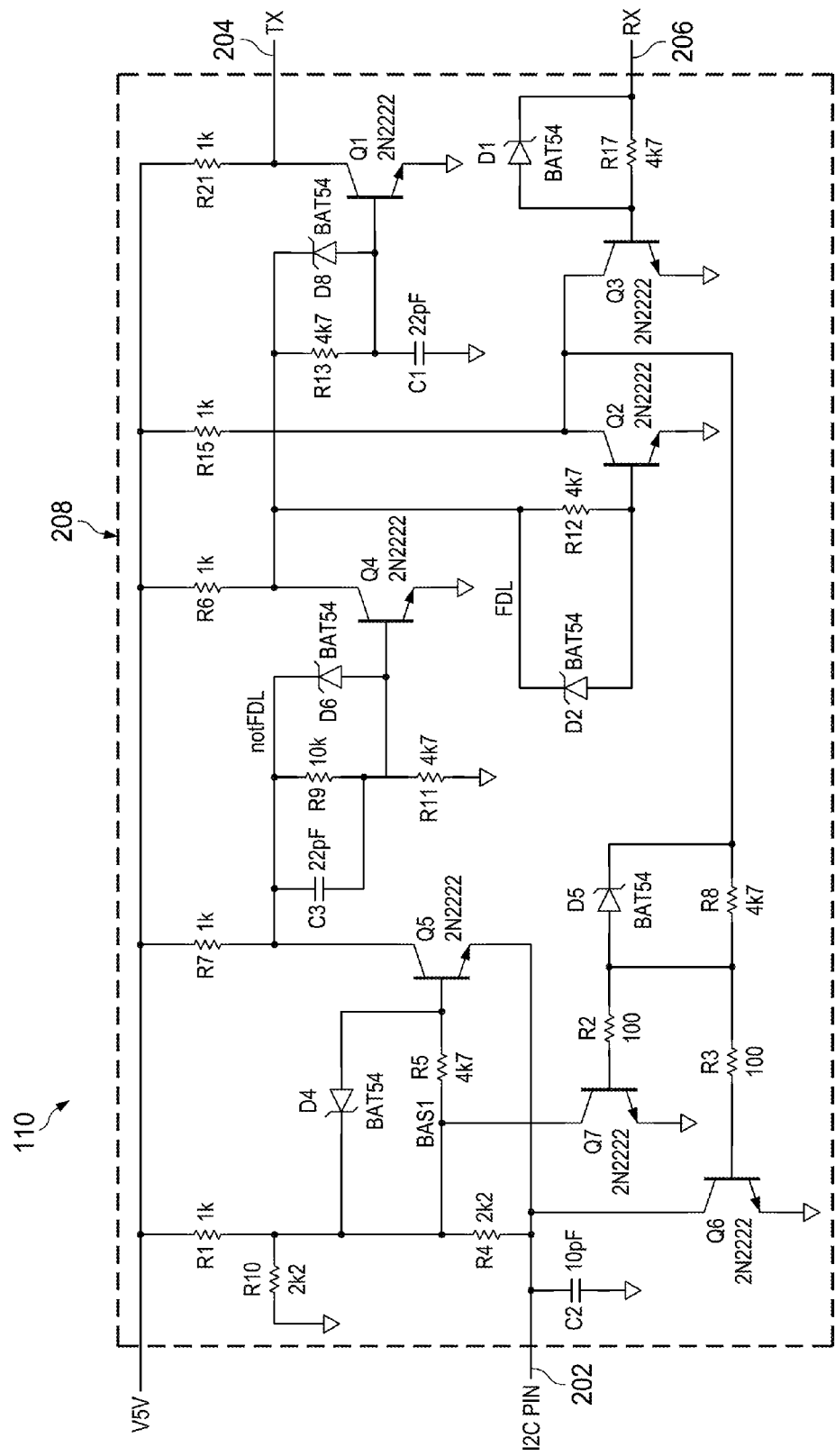
FIG. 2 shows a circuit diagram of a signal separation module in accordance with various examples.

FIG. 2 shows one implementation of the signal separation module 110 in further detail. As shown, the signal separation module 110 includes a single-ended bidirectional pin 202, which couples to the I2C chip 106. Similarly, the signal separation module 110 may couple to the I2C chip 108 as shown in FIG. 1. The bidirectional pin 202 may be for either the clock or data line of the I2C chip 106. The signal separation module also includes a single-ended unidirectional output pin 204, labeled TX, and a single-ended unidirectional input pin 206, labeled RX. The output and input pins 204, 206 are coupled to the differential signal transceiver 112, which converts single-ended signals to differential and vice versa.

The signal separation module 110 also includes signal separation logic 208. The following discussion will address the functionality of the signal separation logic 208 when both the host 102 and the remote 104 write a logic high (i.e., when bidirectional I2C pins are deasserted) and when either of the host 102 or the remote 104 writes a logic low (i.e., when one of the bidirectional I2C pins is asserted).

When both the host 102 and the remote 104 write a logic high, the I2C pin 202 and the RX pin 206 are at or near 5V, in this example. The I2C pin 202 being at 5V causes no current to flow through resistor R4, and consequently the base to emitter of transistor Q5 is not polarized and transistor Q5 is disabled (i.e., does not conduct). Thus, the base to emitter of transistor Q4 is polarized such that transistor Q4 is enabled (i.e., conducts) and the base to emitter of transistor Q1 is not polarized and transistor Q1 is disabled. As a result, the logic high of the I2C pin 202 is transmitted to the TX pin 204.

Additionally, the RX pin 206 being at 5V causes the base to emitter of transistor Q3 to be polarized such that transistor Q3 is enabled. Thus, transistor Q3 may be referred to an "input" transistor because it is coupled to the RX pin 206, which is an input to the signal separation module 110. This results in the base to emitter of both transistors Q6 and Q7 to not be polarized such that transistors Q6 and Q7 are disabled. As a result, the I2C pin 202 is not pulled to ground, and no current flows through R4, so the above circuit functionality remains undisturbed.

When the I2C pin 202 is asserted and thus driven to 0V, current flows through resistor R4, which polarizes the base to emitter of transistor Q5 and transistor Q5 is enabled. Transistor Q5 may be referred to as a "current-sensing" transistor because the transistor is enabled when current flows through resistor R4. The base to emitter of transistor Q4 thus becomes not polarized and Q4 is disabled. As a result, the base to emitter of transistor Q1 is polarized and transistor Q1 is enabled, causing the TX pin 204 to be driven to 0V. Additionally, the base to emitter of transistor Q2 is polarized and transistor Q2 is enabled; because of the capacitor C1, transistor Q2 is enabled prior to transistor Q1 being enabled. The transistor Q4 may be referred to as an "activating" transistor because when transistor Q4 is disabled, transistor Q2 is enabled or activated. As a result of transistor Q2 being enabled, any subsequent change to the RX pin 206 (e.g., being driven to 0V, which causes transistor Q3 to be disabled) is not transferred to transistors Q6 and Q7, which would affect the current through resistor R4, since transistor Q2 maintains a connection to ground. Thus, transistor Q2 may be referred to as an "input-blocking" transistor because when transistor Q2 is enabled, changes to the RX pin 206 are not transmitted to transistors Q6 and Q7.

Alternately, when the I2C pin 202 remains deasserted and the RX pin 206 is asserted and thus driven to 0V, transistor Q3 is disabled. The transistor Q2 is also disabled, since the transistor Q2 is only enabled when the I2C pin 202 is asserted. Thus, the node between the collectors of transistors Q2 and Q3, which is also the base of transistors Q6 and Q7, is polarized with respect to ground, or the emitters of transistors Q6 and Q7. As a result, transistors Q6 and Q7 are enabled and the I2C pin 202 is driven to 0V. However, unlike the above case where current flows through resistor R4 and causes the TX pin 204 to be driven to 0V, transistors Q6 and Q7 both conducting results in no current flowing through resistor R4. Thus, the effect of the RX pin 206 being asserted and subsequently causing the I2C pin 202 to be driven to ground is not seen by the TX pin 204. Transistors Q6 and Q7 may be referred to as an "opposite current condition" transistor pair because although they assert the I2C pin 202 when enabled, they prevent current from flowing through resistor R4 and thus no current condition is detected.

As a result of the above signal separation module 110 functionality, proper signal transmission is maintained in a voltage-independent manner. As a brief summary, in one case the signal separation logic 208 detects a current flow condition that indicates the bidirectional pin 202 is asserted by the I2C chip 106. For example, the current flowing through the resistor R4 may be a current flow condition. Alternately, an indication that current is generally flowing toward the I2C chip 106 indicates that the I2C chip 106 (rather than the I2C chip 108 through the RX pin 206) is driving a pin to 0V. As a result of the existence of the current flow condition, the signal separation logic 208 asserts the TX pin 204 and prevents the RX pin 206 from affecting the bidirectional pin 202.

Additionally, the signal separation logic 208 detects detect an opposite current flow condition that indicates that the RX pin 206 is asserted by the differential signal transceiver 112. For example, no current flowing through the resistor R4 and transistors Q6 and Q7 being enabled may be an opposite current flow condition. Alternately, an indication that current is generally flowing toward the differential signal transceiver 112 indicates that the I2C chip 108 (rather than the I2C chip 106 through the bidirectional pin 202) is driving a pin to 0V. As a result of the existence of the opposite current flow condition, the signal separation logic 208 asserts the bidirectional pin 202 and prevents the assertion of the bidirectional pin 202 from affecting the TX pin 204.

Figure 3:
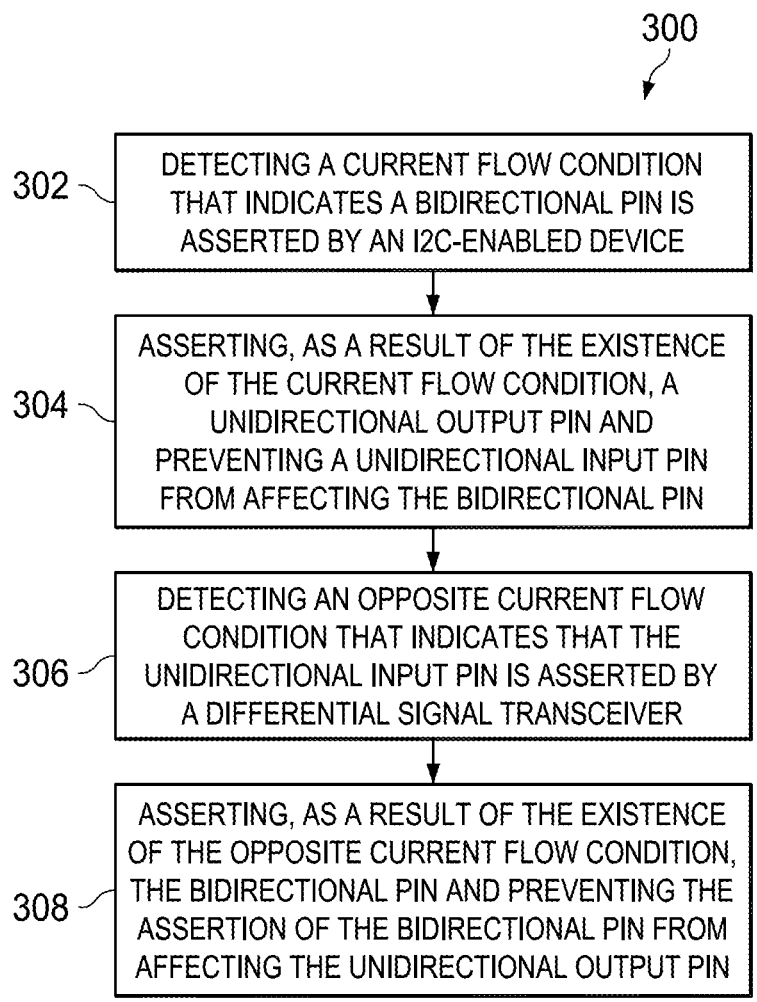
FIG. 3 shows a method flow chart in accordance with various examples.

FIG. 3 shows a method 300 in accordance with various implementations of the present disclosure. The method 300 beings in block 302 with detecting a current flow condition that indicates a bidirectional pin 202 is asserted by an I2C-enabled device 106. The method 300 continues in block 304 with asserting, as a result of the existence of the current flow condition, a unidirectional output pin 204 and preventing a unidirectional input pin 206 from affecting the bidirectional pin 202.

Next, the method 300 continues in block 306 with detecting an opposite current flow condition that indicates that the unidirectional input pin 206 is asserted by a differential signal transceiver 112. As explained above, this may result from a connected I2C-enabled device 108 transmitting an asserted signal to the I2C-enabled device 106. The method 300 then continues in block 308 with asserting, as a result of the existence of the opposite current flow condition, the bidirectional pin 202 and preventing the assertion of the bidirectional pin 202 from affecting the unidirectional output pin 204.

The above discussion is meant to be illustrative of the principles and various embodiments of the present invention. Numerous variations and modifications will become apparent to those skilled in the art once the above disclosure is fully appreciated. For example, the hardware implementation of the signal separation module may utilize more or less electronic components than those shown. Additionally, although primarily described with respect to a 3.3V host and devices, the systems and methods may also apply to different voltage levels, for example by changing the values (e.g., resistance, capacitance, etc.) of various circuit components. Hardware design, by its nature, may be implemented in many equivalent ways, and the scope of the present disclosure is intended to cover all such implementations. It is intended that the following claims be interpreted to embrace all such variations and modifications.

What is claimed is:

1. A signal separation module, comprising:
    a single-ended bidirectional pin coupled to a processing device;
    a single-ended unidirectional output pin coupled to a differential signal transceiver;
    a single-ended unidirectional input pin coupled to the differential signal transceiver; and
    signal separation logic configured to:
        detect a current flow condition that indicates the bidirectional pin is asserted by the processing device;
        assert, as a result of the existence of the current flow condition, the unidirectional output pin and prevent the unidirectional input pin from affecting the bidirectional pin;
        detect an opposite current flow condition that indicates that the unidirectional input pin is asserted by the differential signal transceiver; and
        assert, as a result of the existence of the opposite current flow condition, the bidirectional pin and prevent the assertion of the bidirectional pin from affecting the unidirectional output pin.

2. The signal separation module of claim 1 wherein the signal separation logic comprises:
    a current-sensing transistor;
    an activating transistor; and
    an input-blocking transistor;
    wherein each transistor comprises a base, a collector, and an emitter; and
    wherein the current flow condition comprises a voltage drop across a resistor that polarizes the base to emitter of the current-sensing transistor, which, in turn, causes the base to emitter of the activating transistor not to be polarized, which, in turn, causes the base to emitter of the input-blocking transistor to be polarized and prevent the unidirectional input pin from affecting the bidirectional pin.

3. The signal separation module of claim 2 wherein the base to emitter of the input blocking transistor is polarized before the unidirectional output pin is asserted.

4. The signal separation module of claim 1 wherein the signal separation logic comprises:
    an input transistor;
    an activating transistor;
    an opposite current condition transistor pair; and
    a current-sensing transistor;
    wherein each transistor comprises a base, a collector, and an emitter; and
    wherein when the unidirectional input pin is asserted and the bidirectional pin is not asserted, the base to emitter of the input transistor is not polarized and the base to emitter of the activating transistor is polarized, which, in turn, polarizes the base to emitter of the opposite current condition transistor pair and causes the bidirectional pin to be asserted and the base to emitter of a current-sensing transistor to be not polarized.

5. The signal separation module of claim 1 wherein the processing device is an I2C-enabled device.

6. The signal separation module of claim 1 wherein the single-ended bidirectional pin is coupled to a clock pin or a data pin of the processing device.

7. A communication system, comprising a host device coupled to a remote device, each of the host device and the remote device comprising:
    a processing device comprising a single-ended bidirectional pin;
    a first differential signal transceiver comprising:
        a single-ended unidirectional input pin;
        a single-ended unidirectional output pin; and
        a differential bidirectional pin coupled to a corresponding differential bidirectional pin of the first differential signal transceiver of the other device;
    a first signal separation module coupled to the bidirectional pin of the processing device and the unidirectional pins of the first differential signal transceiver, the first signal separation module to:
        detect a current flow condition that indicates the bidirectional pin is asserted by the processing device;

assert, as a result of the existence of the current flow condition, a pin coupled to the unidirectional input pin and prevent the unidirectional output pin from affecting the bidirectional pin;

detect an opposite current flow condition that indicates that the unidirectional output pin is asserted by the first differential signal transceiver; and assert, as a result of the existence of the opposite current flow condition, the bidirectional pin and prevent the assertion of the bidirectional pin from affecting the unidirectional input pin.

8. The communication system of claim 7 wherein the signal separation module comprises:

a current-sensing transistor;
an activating transistor; and
an input-blocking transistor;
wherein each transistor comprises a base, a collector, and an emitter; and
wherein the current flow condition comprises a voltage drop across a resistor that polarizes the base to emitter of the current-sensing transistor, which, in turn, causes the base to emitter of the activating transistor not to be polarized, which, in turn, causes the base to emitter of the input-blocking transistor to be polarized and prevent the unidirectional input pin from affecting the bidirectional pin.

9. The communication system of claim 8 wherein the base to emitter of the input blocking transistor is polarized before the unidirectional output pin is asserted.

10. The communication system of claim 7 wherein the signal separation module comprises:

an input transistor;
an activating transistor;
an opposite current condition transistor pair; and
a current-sensing transistor;
wherein each transistor comprises a base, a collector, and an emitter; and
wherein when the unidirectional input pin is asserted and the bidirectional pin is not asserted, the base to emitter of the input transistor is not polarized and the base to emitter of the activating transistor is polarized, which, in turn, polarizes the base to emitter of the opposite current condition transistor pair and causes the bidirectional pin to be asserted but the base to emitter of the current-sensing transistor to be not polarized.

11. The communication system of claim 7 wherein the processing device is an I2C-enabled device.

12. The communication system of claim 7 further comprising a plurality of hosts coupled to a plurality of remote devices.

13. The communication system of claim 7 further comprising a second differential signal transceiver and a second signal separation module, wherein the first differential signal transceiver and signal separation module are to transmit and receive a clock signal between the host and remote devices and the second differential signal transceiver and signal separation module are to transmit and receive a data signal between the host and remote devices.

14. A method for bidirectional signal separation, comprising:

detecting a current flow condition that indicates a bidirectional pin is asserted by a processing device;

asserting, as a result of the existence of the current flow condition, a unidirectional output pin and preventing a unidirectional input pin from affecting the bidirectional pin;

detecting an opposite current flow condition that indicates that the unidirectional input pin is asserted by a differential signal transceiver; and asserting, as a result of the existence of the opposite current flow condition, the bidirectional pin and preventing the assertion of the bidirectional pin from affecting the unidirectional output pin.

15. The method of claim 14 wherein the processing device is an I2C-enabled device.

16. The method of claim 14 further comprising:

polarizing the base to emitter of a current-sensing transistor as a result of the current flow condition, which comprises a voltage drop across a resistor;

not polarizing the base to emitter of an activating transistor as a result of polarizing the base to emitter of the current-sensing transistor;

polarizing the base to emitter of an input-blocking transistor and preventing the unidirectional input pin from affecting the bidirectional pin as a result of not polarizing the base to emitter of the activating transistor.

17. The method of claim 16 further comprising polarizing the base to emitter of the input blocking transistor before asserting the unidirectional output pin.

18. The method of claim 14 further comprising:

not polarizing the base to emitter of an input transistor and polarizing the base to emitter of an activating transistor when the unidirectional input pin is asserted and the bidirectional pin is not asserted;

as a result of not polarizing the base to emitter of the input transistor and polarizing the base to emitter of the activating transistor, polarizing the base to emitter of an opposite current condition transistor pair, which causes the bidirectional pin to be asserted but the base to emitter of a current-sensing transistor to be not polarized.

* * * * *